(12) United States Patent
Pang et al.

(10) Patent No.: US 6,475,013 B1
(45) Date of Patent: Nov. 5, 2002

(54) ELECTRICAL CONNECTOR HAVING ACTUATION DEVICE

(75) Inventors: Shaofei Pang, Shenzhen (CN); Ren-Chih Li, Shenzhen (CN); Tao Xu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/068,281

(22) Filed: Feb. 4, 2002

(51) Int. Cl.$^7$ .............................................. H01R 13/625
(52) U.S. Cl. ...................................................... 439/342
(58) Field of Search .......................... 439/342, 259–270

(56) References Cited

U.S. PATENT DOCUMENTS 6,116,936 A * 9/2000 Pei ............................. 439/342
6,146,178 A * 11/2000 Walkup et al. ............... 439/342
6,250,941 B1 * 6/2001 Huang et al. ................ 439/342
6,338,640 B1 * 1/2002 Lin ............................. 439/342

* cited by examiner

Primary Examiner—Hien Vu
(74) Attorney, Agent, or Firm—WeiTe Chung

(57) ABSTRACT

An electrical connector comprises a base, a cover, a gear and a rack. The base having a plurality of passageways opened therein. The cover is slidable engaged with the base. The gear and the rack are provided for actuating the cover to slide on the base. Because rotation of the gear is controlled accurately, the actuation process can be operated easily and precisely.

7 Claims, 5 Drawing Sheets

ELECTRICAL CONNECTOR HAVING ACTUATION DEVICE

BACKGROUND OF THE INVENTION

1. Field of the invention

The present invention relates to electrical connectors, especially to a Central Processing Unit (CPU) connector having an actuation device for actuating the connector to engage with pins of a CPU.

2. Description of the prior art

Referring to FIGS. 7 and 8, a prior art CPU connector 6 for electrically connecting a CPU with a printed circuit board (PCB) is shown. The connector 6 has a housing 7, a cover 8 having a plurality of holes formed therein and being slidable on the housing 7 and an actuation device 9 for actuating the cover 8 to slide on the housing 7.

The actuation device 9 comprises a cam 91 and a plate 92. The cam 91 has a pivot portion 93 for inserting through aligned hole 921 in the plate 92 and then being riveted thereto. When the cam 91 is rotated, the cover 8 slides on the housing 7 to electrically connect the CPU with the PCB.

However, the conventional CPU connector actuation device 9 is relatively difficult to be controlled due to inherent structure of the cam 91. The rotation of the cam 91 is irregularly and rotation degrees of the cam 91 cannot be controlled accurately such that idle stroke situations or over-actuation of the cover 8 occur occasionally.

Accordingly, an improved actuation device is required to overcome the above disadvantage of conventional CPU connector actuation device 9.

SUMMARY OF THE INVENTION

An object of the present invention is to provide an electrical connector having an actuation device for accurately actuating the connector to engage with pins of a CPU.

To achieve the above object, an electrical connector in accordance with a preferred embodiment of the present invention comprises a base and a cover. The base having a plurality of passageways opened therein. The cover being slidably engaged with the base. A gear and a rack engaged with the base and the cover. Wherein the rack is positioned in the cover and the gear is supported by the base, and the gear is rotatable to actuate the rack and therefore to slide the cover along the base. Because rotation of the gear is regularly and rotation degree of the gear can be controlled accurately, the actuation process can be operated precisely so as to idle stroke situations will not occur.

Other objects, advantages and novel features of the present invention will be drawn from the following detailed description of preferred embodiments of the present invention with attached drawings, in which:

DESCRIPTION OF PREFERRED EMBODIMENTS OF THE INVENTION

Figure 1:
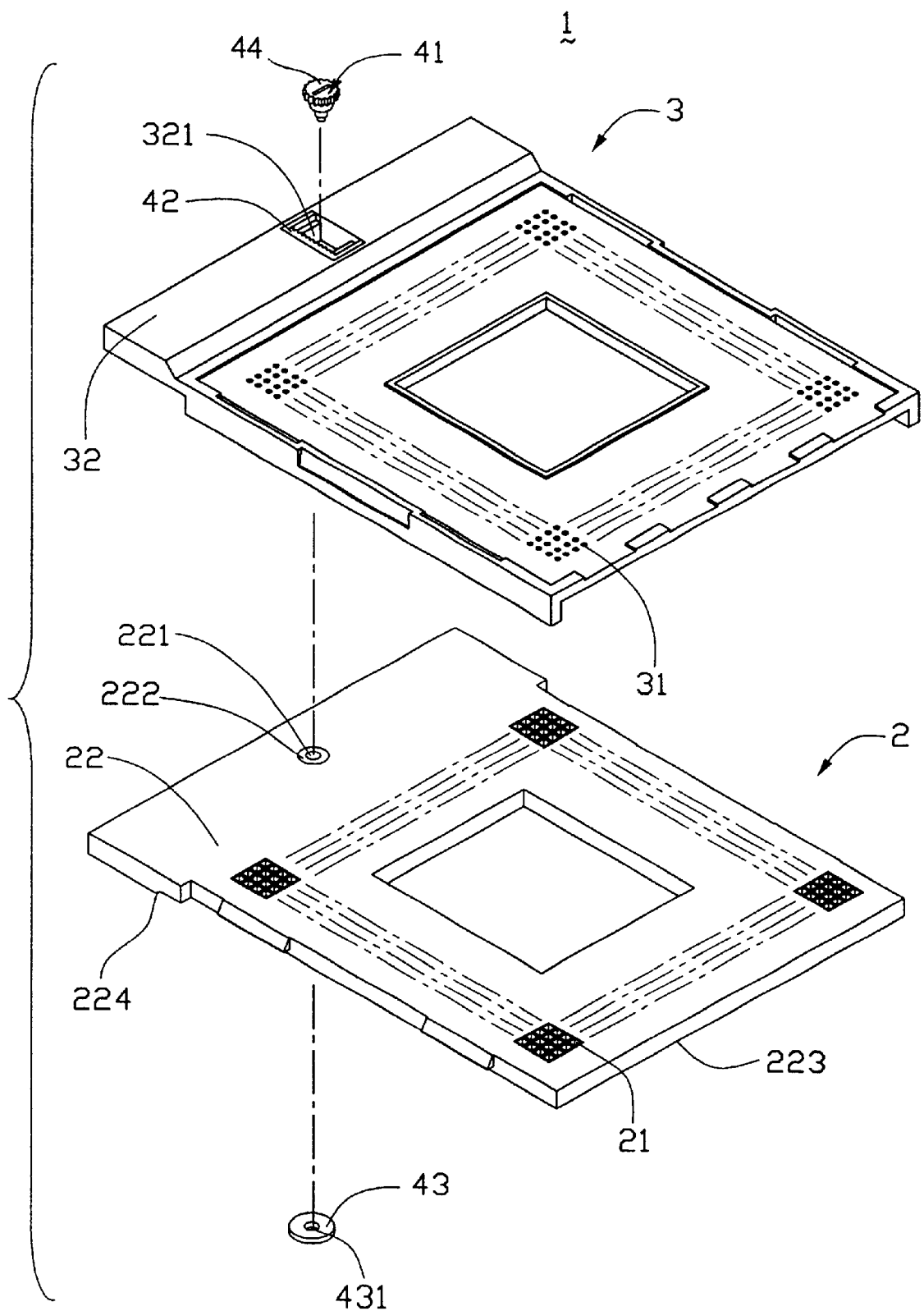
FIG. 1 is an exploded view of a CPU connector in accordance with a preferred embodiment of the present invention.

Reference will now be made to the drawing figures to describe the present invention in detail.

As shown in FIG. 1, a CPU connector 1 in accordance with a preferred embodiment of the present invention comprises a base 2, a cover 3 slidably attached to the base 2 and an actuation device 4 for actuating the cover 3 to slide along the base 2. The base 2 has a plurality of contact-receiving passageways 21 for securing corresponding contacts (not shown) therein. A base platform 22 which is formed on the base 2 has a slot 221 opened therein. A washer 222 is positioned around the slot 221. A bottom surface 223 of the base 2 has a stand off 224 formed thereon.

The cover 3 has a plurality of through holes 31 formed therein for receiving CPU pins (not shown). A cover platform 32 which is defined on the cover 3 corresponding to the base platform 22 has an opening 321 with respect to the slot 221.

Figure 2:
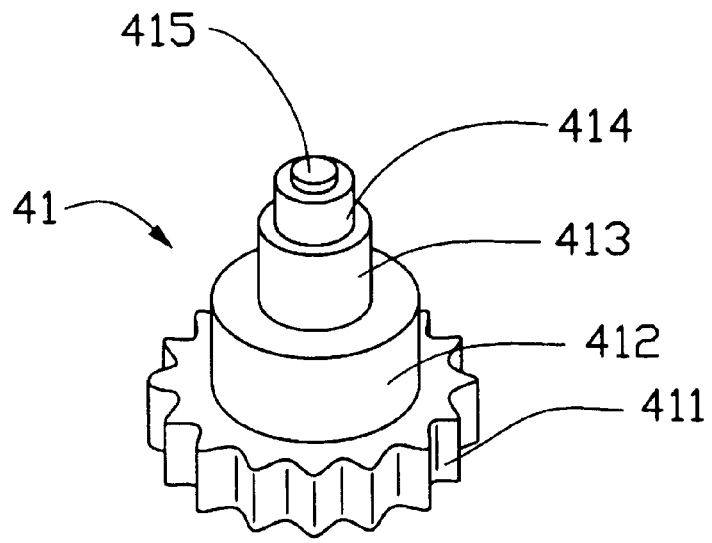
FIG. 2 is an enlarged perspective view of a gear of the connector of FIG. 1.
Figure 3:
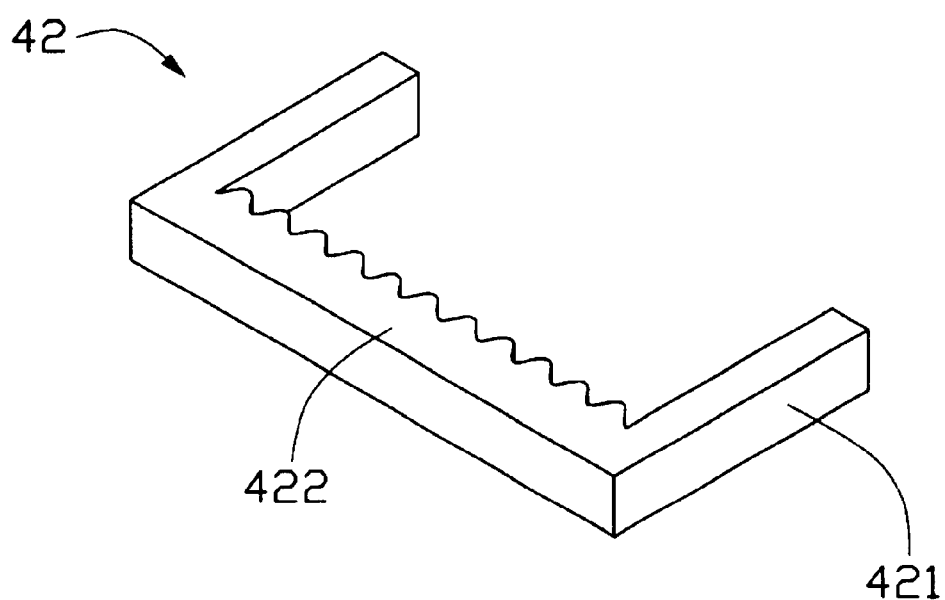
FIG. 3 is an enlarged perspective view of a rack of the connector of FIG. 1.

Referring to FIGS. 1, 2 and 3, the actuation device 4 comprises a gear 41, a rack 42 and a plate 43. The gear 41 has an gear portion 411, a brace portion 412, a joint portion 413 and a pivot portion 414 with a head 415 formed thereon. The rack 42 is substantially U-shaped which has two arm portions 421 and a rack portion 422. The plate 43 has a through hole 431 opened therein. The gear 41 further includes a tool operation face 44 upwardly exposed to an exterior for being operated by the tool or the hand.

Figure 4:
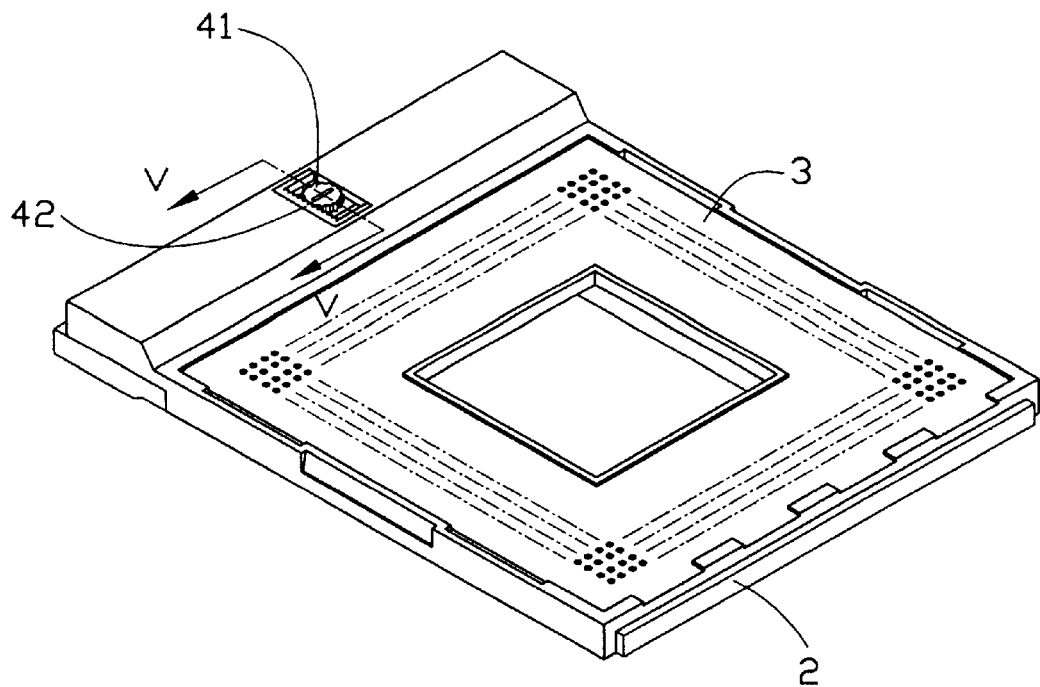
FIG. 4 is an assembled view of the CPU connector of FIG. 1.
Figure 5:
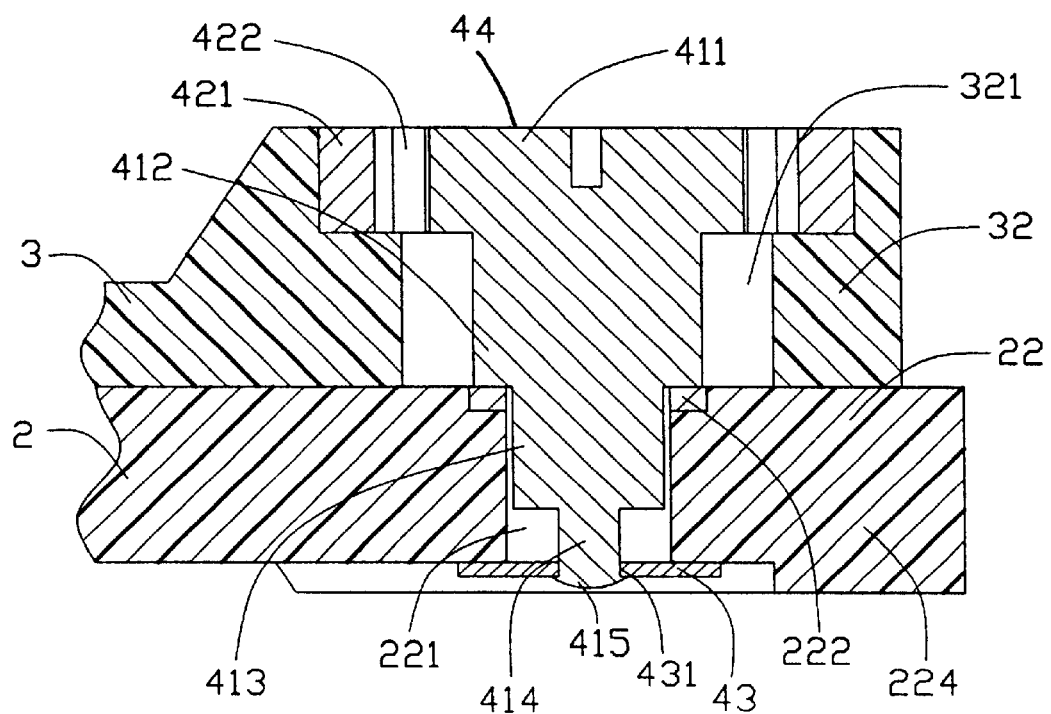
FIG. 5 is a cross sectional view taken along line V—V of FIG. 4.

As shown in FIGS. 4 and 5, in assembly, the cover 3 is slidably mounted on the base 2. The rack 42 is positioned in the opening 321 of the cover platform 32 and the two arm portions 421 are insert molded in the cover 3. The gear 41 is inserted into the opening 321 and the slot 221 with the gear portion 411 and the brace portion 412 being located in the opening 321 and with the joint portion 413 and the pivot portion 414 being located in the slot 221. The brace portion 412 is positioned on the washer 222 to avoid direct frictional engagement of the gear 41 and the base 2. The head portion 415 is inserted into the through hole 431 of the plate 43 and then being riveted thereto to fasten the gear 41 and the plate 43 together, therefore the cover 3, the base 2 and the actuation device 4 are assembled together. During actuation process, the gear portion 411 of the gear 41 is rotated and engaged with the rack portion 422 of the rack 42 to actuate the cover 3 to slide on the base 2. Because rotation of the gear 41 is regularly and rotation degree of the gear 41 can be controlled accurately, the actuation process can be operated easily and precisely.

Figure 6:
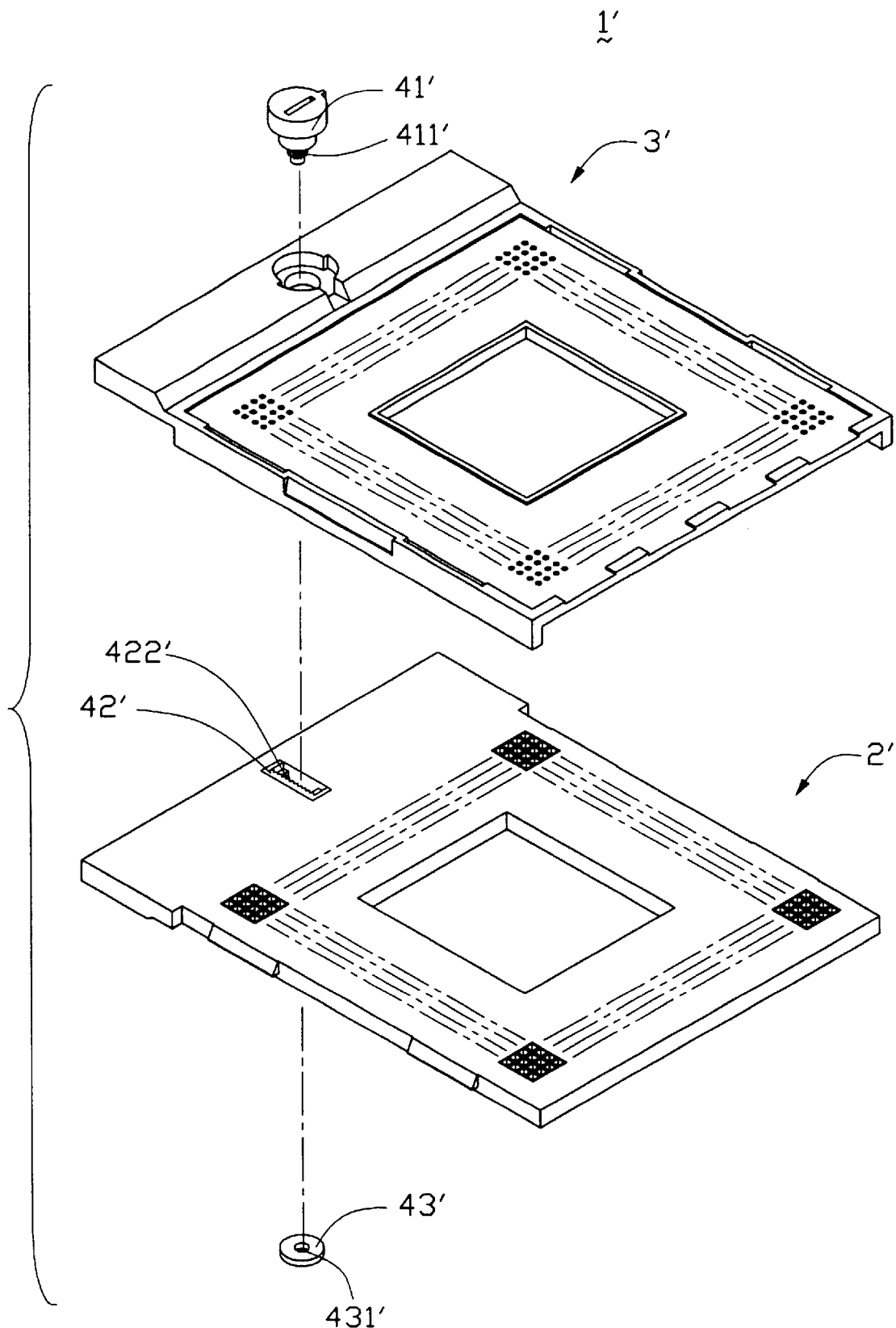
FIG. 6 is an exploded view of a CPU connector in accordance with another embodiment of the present invention.
Figure 7:
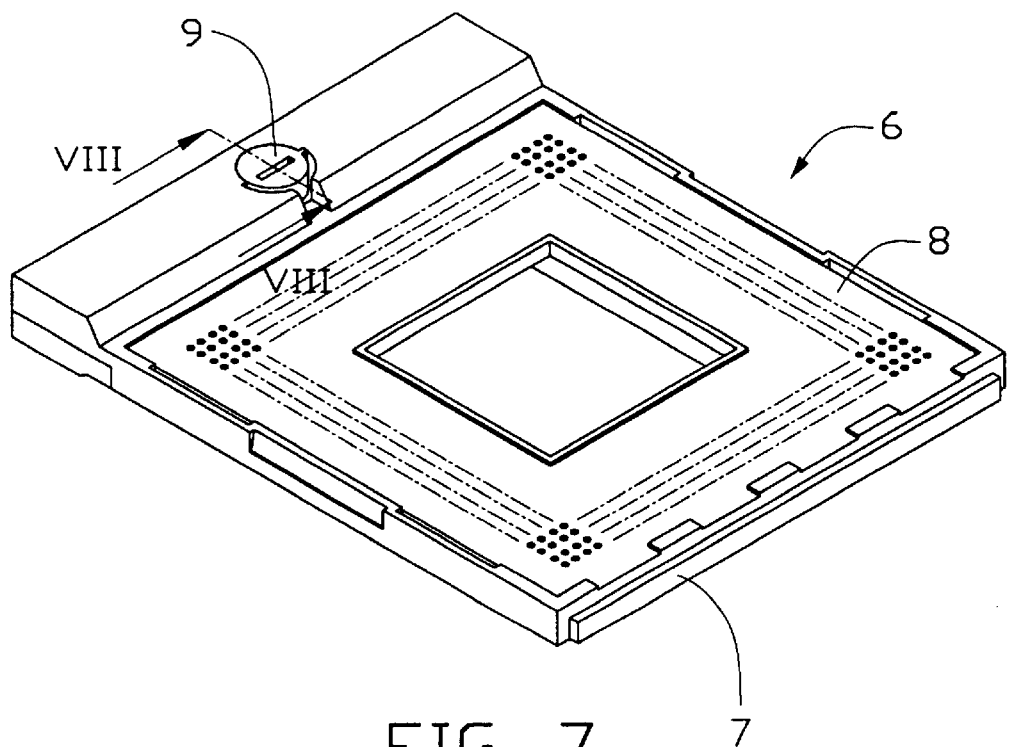
FIG. 7 is an assembled view of a conventional CPU connector.
Figure 8:
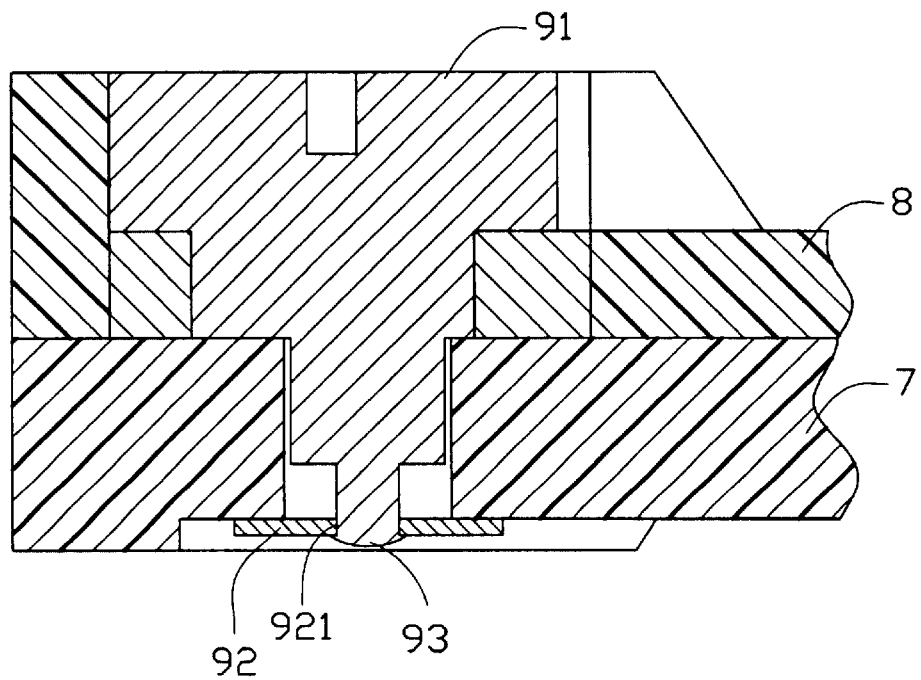
FIG. 8 is a cross sectional view taken along line VIII—VIII of FIG. 7.

FIG. 6 shows another embodiment in accordance with the present invention. A gear 41' is positioned in a cover 3' of a CPU connector 1' and a rack 2' is insert molded in a base 2' of the CPU connector 1'. A plate 43' which has a through hole 431' defined therein for riveting with the gear 41' to assemble the gear 41', the rack 2' and the plate 43' together. A gear portion 411' of the gear 41' can engage with a rack portion 422' of the rack 42' during actuation process. With such a structure, this embodiment still achieves the accurate actuation function.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector comprising;
   a stationary base having a plurality of contact receiving passageways therein;
   a cover mounted on said base having therein a plurality of through holes in alignment with the corresponding contact receiving passageways, respectively, said cover being moveable relative to said base in a front-to-back direction thereof,
   an actuation device including a rotative Sear receivably and at least partially mounted in one of said base and said cover, and a rack with arms receiveably mounted in the other of said base and said cover; wherein said gear defines an operation face upwardly exposed to an exterior of said cover, and a gear portion of said gear which is rotatively engaged with a rack portion of the rack, the gear portion moved relatively along the rack portion in a direction of said front-to-back direction when said gear is rotated, thus resulting in the cover being moved relative to the base along said front-to-back direction; wherein said gear substantially extends through both said cover and said base.

2. The connector as described in claim 1, wherein said rack is immoveable relative to the other of said base and said cover.

3. The connector as described in claim 2, wherein said rack is mounted in said cover.

4. The connector as described in claim 2, wherein said rack is mounted in said base.

5. The connector as described in claim 1, wherein said rack is mounted in the cover and the gear portion is disposed in said cover.

6. The connector as described in claim 1, wherein said rack is mounted in the base and the gear portion is disposed in the base.

7. The connector as described in claim 1, wherein said gear is moveable relative to the other of said base and said cover.

* * * * *